(12) United States Patent  
Abd Elhamid et al.

(10) Patent No.: US 7,955,754 B2
(45) Date of Patent: *Jun. 7, 2011

(54) ENHANCED STABILITY BIPOLAR PLATE

(75) Inventors: Mahmoud H. Abd Elhamid, Grosse Pointe Woods, MI (US); Richard H. Blunk, Macomb Township, MI (US); Gayatri Vyas, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 637 days.

This patent is subject to a terminal disclaimer.

(21) Appl. No.: 10/895,249

(22) Filed: Jul. 20, 2004

(65) Prior Publication Data

US 2006/0019142 A1 Jan. 26, 2006

(51) Int. Cl.
*H01M 8/02* (2006.01)
*B05D 5/12* (2006.01)
*B32B 15/01* (2006.01)
*C23C 14/34* (2006.01)

(52) U.S. Cl. ........ 429/518; 429/535; 428/681; 427/115; 427/123; 204/192.15

(58) Field of Classification Search ............... 429/12, 429/34, 40, 210
See application file for complete search history.

(56) References Cited

U.S. PATENT DOCUMENTS

| | | | |
|---|---|---|---|
| 4,915,752 A | 4/1990 | Culling | |
| 5,250,162 A * | 10/1993 | Foller et al. | 205/687 |
| 5,268,045 A | 12/1993 | Clare | |
| 5,376,464 A | 12/1994 | Dupoiron et al. | |
| 5,624,769 A * | 4/1997 | Li et al. | 429/32 |
| 5,643,690 A | 7/1997 | Tateishi et al. | |
| 8,228,522 | 5/2001 | Batawi et al. | |
| 6,322,919 B1 | 11/2001 | Yang et al. | |
| 6,372,376 B1 | 4/2002 | Fronk et al. | |
| 6,454,922 B1 * | 9/2002 | Weisbrod | 204/404 |
| 6,649,031 B1 * | 11/2003 | Iqbal et al. | 204/192.15 |
| 6,699,593 B2 * | 3/2004 | Kaneta et al. | 428/670 |
| 7,150,918 B2 | 12/2006 | Brady | |
| 2001/0006702 A1 | 7/2001 | Hisada et al. | |
| 2002/0187379 A1 * | 12/2002 | Yasuo et al. | 429/34 |
| 2003/0099847 A1 * | 5/2003 | Cunningham et al. | 428/469 |
| 2003/0170526 A1 * | 9/2003 | Hodgson et al. | 429/34 |
| 2003/0228512 A1 | 12/2003 | Vyas et al. | |

(Continued)

FOREIGN PATENT DOCUMENTS

| | | |
|---|---|---|
| JP | 6310153 | 11/1994 |
| JP | 10228914 | 8/1998 |
| JP | 2001-006713 | 1/2001 |
| JP | 2001093538 A | 4/2001 |
| WO | 03028134 A1 | 4/2003 |

OTHER PUBLICATIONS

International Search Report dated Oct. 18, 2006 regarding International Application No. PCT/US05/28469.

*Primary Examiner* — Dah-Wei Yuan
*Assistant Examiner* — Angela J. Martin
(74) *Attorney, Agent, or Firm* — Reising Ethington P.C.

(57) ABSTRACT

An enhanced stability and inexpensive bipolar plate for a fuel cell is disclosed. The enhanced stability bipolar plate includes a bipolar plate substrate and a corrosion-resistant coating provided on the bipolar plate substrate. A method for enhancing corrosion resistance of a bipolar plate is also disclosed.

14 Claims, 4 Drawing Sheets

U.S. PATENT DOCUMENTS

| | | |
|---|---|---|
| 2004/0005502 A1* | 1/2004 | Schlag .......................... 429/245 |
| 2004/0091768 A1 | 5/2004 | Abd Elhamid et al. |
| 2004/0197593 A1 | 10/2004 | Chellappa |
| 2005/0017055 A1 | 1/2005 | Kurz et al. |
| 2005/0025897 A1 | 2/2005 | Van Steenkiste et al. |
| 2005/0037212 A1* | 2/2005 | Budinski ....................... 428/457 |
| 2005/0037935 A1* | 2/2005 | Abd Elhamid et al. ....... 510/175 |
| 2006/0019142 A1 | 1/2006 | Elhamid et al. |
| 2006/0078776 A1 | 4/2006 | Elhamid et al. |
| 2007/0099012 A1* | 5/2007 | Brady et al. .................. 428/457 |

* cited by examiner

ENHANCED STABILITY BIPOLAR PLATE

FIELD OF THE INVENTION

The present invention relates to fuel cells, which generate electricity to power vehicles or other machinery. More particularly, the present invention relates to a bipolar plate, which is coated with a corrosion-resistant coating of a high-grade stainless steel or alloy to impart fluoride resistance to the bipolar plate when used in a polyelectrolyte membrane (PEM) fuel cell.

BACKGROUND OF THE INVENTION

Fuel cell technology is a relatively recent development in the automotive industry. It has been found that fuel cell power plants are capable of achieving efficiencies as high as 55%. Furthermore, fuel cell power plants emit only heat and water as by-products.

Fuel cells include three components: a cathode, an anode and an electrolyte which is sandwiched between the cathode and the anode and passes only protons. Each electrode is coated on one side by a catalyst. In operation, the catalyst on the anode splits hydrogen into electrons and protons. The electrons are distributed as electric current from the anode, through a drive motor and then to the cathode, whereas the protons migrate from the anode, through the electrolyte to the cathode. The catalyst on the cathode combines the protons with electrons returning from the drive motor and oxygen from the air to form water. Individual fuel cells can be stacked together in series to generate increasingly larger quantities of electricity.

In a Polymer-Electrolyte-Membrane (PEM) fuel cell, a polymer electrode membrane serves as the electrolyte between a cathode and an anode. The polymer electrode membrane currently being used in fuel cell applications requires a certain level of humidity to facilitate conductivity of the membrane. Therefore, maintaining the proper level of humidity in the membrane, through humidity/water management, is very important for the proper functioning of the fuel cell. Irreversible damage to the fuel cell will occur if the membrane dries out.

In the PEM fuel cell, multiple fuel cells are frequently stacked in series to form a fuel cell stack. In the fuel cell stack, one side of a flow field plate serves as the anode for one fuel cell while the opposite side of the flow field plate serves as the cathode for an adjacent fuel cell. Because each flow field plate serves as both an anode and a cathode, the flow field plate is also known as a bipolar plate. Monopolar plates, such as anode coolant flow field plates, may be provided in the fuel cell stack. One side of the anode coolant flow field plate serves as an anode flow field plate. The opposite side of the anode coolant flow field plate serves as a cathode coolant flow field plate. Coolant channels of the anode coolant flow field plate and of the cathode coolant flow field plate may be combined to form collective coolant channels for cooling the fuel cell stack.

Bipolar plates for PEM fuel cells must be electrochemically stable, electrically conductive and inexpensive. The corrosion of metallic bipolar plates in the fuel cell environment accelerates the corrosion process through degradation of the membrane. The degradation products of the membrane include hydrogen fluoride (HF), which accelerates the corrosion process, causing the corrosion process to become autocatalytic in nature. 316L and other lower grades of stainless steels have been used as inexpensive bipolar plate materials.

While 316L stainless steel exhibits a fair corrosion resistance to fluoride ions, the corrosion rate increases with the increase in the fluoride ion leach out rate. This problem can be mitigated somewhat by removing the hydrogen fluoride from the fuel cell environment or by using higher grades of stainless steel which are more resistant to corrosion by fluoride ions than 316L stainless steel. The use of higher grades of stainless steel for the bipolar plate tends to increase the cost of the bipolar plate.

Various methods are known for increasing the corrosion resistance of a corrosion-susceptible substrate. For example, U.S. 20030228512 A1 discloses a method of improving the contact resistance of the surface of a stainless steel substrate while maintaining optimum corrosion resistance of the substrate by depositing a gold coating on the substrate. U.S. 20040091768 A1 discloses a method of increasing the corrosion resistance of a substrate by providing a polymeric conductive coating on the substrate. U.S. Pat. No. 6,372,376 B1 discloses a method of increasing the corrosion resistance of a substrate by providing an electrically-conductive, corrosion-resistant polymer containing a plurality of electrically conductive, corrosion-resistant filler particles on the substrate.

It has been found that coating the surface of a lower grade stainless steel bipolar plate, such as a 316L or 304L stainless steel bipolar plate, for example, with a thin layer of high-grade stainless steel or alloy imparts a high degree of fluoride ion corrosion resistance to the bipolar plate while maintaining the cost of the bipolar plate within acceptable levels.

SUMMARY OF THE INVENTION

The present invention is generally directed to a novel bipolar plate which is characterized by enhanced stability and resistance to fluoride corrosion in a fuel cell. The bipolar plate of the present invention includes a stainless steel bipolar plate substrate which is typically a low-grade stainless steel, such as 316L, for example, and a corrosion-resistant coating, which is a higher-grade stainless steel or alloy, provided on the bipolar plate substrate. The corrosion-resistant coating may be a high-grade stainless steel such as 904L or AL6XN stainless steel, for example. Alternatively, the corrosion-resistant coating may be an alloy such as C-276, 254SMO, Carp-20, niobium and its alloys, tantalum and its alloys, or molybdenum alloys. Accordingly, the stainless steel or alloy coating renders the lower-grade stainless steel bipolar plate substrate substantially resistant to fluoride ions in the fuel cell environment, thus substantially prolonging the lifetime of the bipolar plate.

The present invention is further directed to a novel method for enhancing the corrosion resistance of a bipolar plate. The method includes providing a bipolar plate substrate, which is typically a lower-grade stainless steel such as 316L or 304L stainless steel, for example, and providing a corrosion-resistant coating on the bipolar plate substrate. The corrosion-resistant coating may be a high-grade stainless steel such as 904L or AL6XN stainless steel, for example. Alternatively, the corrosion-resistant coating may be an alloy such as C-276, 254SMO, Carp-20, niobium and its alloys or tantalum and its alloys or molybdenum alloys, for example.

BRIEF DESCRIPTION OF THE DRAWINGS

The invention will now be described, by way of example, with reference to the accompanying drawings, in which.

DETAILED DESCRIPTION OF THE INVENTION

According to the present invention, a bipolar plate substrate, which is a low-grade stainless steel such as 316L stainless steel, is sputter-coated with a higher grade of stainless steel to fabricate a bipolar plate having an improved corrosion resistance to hydrogen fluoride. Preferably, the cathode side of the bipolar plate substrate is coated with a corrosion-resistant coating to increase the resistance of the cathode side of the bipolar plate to corrosion by chloride during operation of a fuel cell. Sputtering the surface of a 316L stainless steel bipolar plate substrate with a thin (0.1-2 µm) corrosion-resistant coating of the higher-grade 904-L or AL6XN stainless steel, for example, significantly lowers the corrosion rate of the bipolar plate in a fluoride ion environment while not adding significant cost to the bipolar plate. Alloys which may be coated on the bipolar plate substrate as the corrosion-resistant coating include C-276, 254SMO, Carp-20, niobium and its alloys, molybdenum alloys or tantalum and its alloys, for example. The contact resistance of the sputtered stainless steel coating can be minimized by providing a cover layer on the stainless steel coating. The cover layer may be a thin layer (<10 nm) of gold (Au) or an organic coating, for example. Other suitable materials for the cover layer include platinum and its alloys, rhodium, ruthenium and its alloys, and palladium and its alloys. Coating a lower-grade stainless steel or material with a higher-grade stainless steel or material according to the invention is cost-effective, since fabricating a bipolar plate using a higher-grade stainless steel or material is cost-prohibitive.

Figure 1:
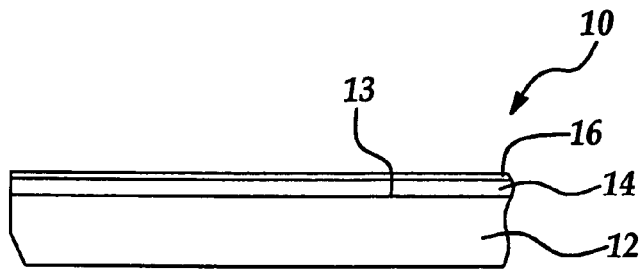
FIG. 1 is a cross-section of a portion of a bipolar plate according to the present invention.

FIG. 1 is a cross-sectional view of an enhanced stability bipolar plate 10, hereinafter bipolar plate, according to the present invention. The bipolar plate 10 includes a bipolar plate substrate 12 which is typically a low-grade stainless steel such as 316L stainless steel, for example. A corrosion-resistant coating 14, which may be a grade of stainless steel higher than that of the bipolar plate substrate 12, is provided on the outer surface 13 of the bipolar plate substrate 12. The corrosion-resistant coating 14 preferably has a thickness of typically about 0.1-2 µm. Suitable grades of stainless steel for the corrosion-resistant coating 14 include 904L ss and AL6XN ss, for example. Alternatively, the corrosion-resistant coating 14 may be an alloy such as C-276, 254SMO, Carp-20 or niobium and its alloys, for example. A cover layer 16, which may be gold (Au) or an organic material, for example, is typically provided on the corrosion-resistant coating 14 to keep the contact resistance of the corrosion-resistant coating 14 low. The thickness of the cover layer 16 is preferably less than typically about 10 nm in the case of gold coatings and typically about 10~28 micrometers in the case of polymeric coatings.

Figure 2:
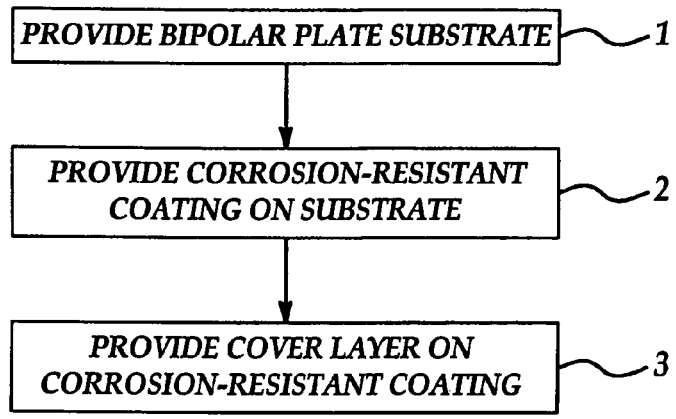
FIG. 2 is a flow diagram illustrating sequential process steps carried out according to a method of fabricating the bipolar plate of the present invention.

FIG. 2 is a flow diagram which illustrates sequential process steps carried out for fabrication of an enhanced stability bipolar plate according to the present invention. In step 1, a bipolar plate substrate is provided. The bipolar plate substrate is typically a low-grade stainless steel such as 316L, for example, and has the suitable size and configuration for use in a fuel cell stack of a fuel cell.

In step 2, a corrosion-resistant coating is provided on the outer surface of the bipolar plate substrate. The thickness of the corrosion-resistant coating is preferably in the range of typically about 0.1-2 µm. The corrosion-resistant coating may be a higher-grade stainless steel including, for example, 904L or AL6XN stainless steel. Alternatively, the corrosion-resistant coating may be a corrosion-resistant alloy such as C-276, 254SMO, Carp-20 or niobium and its alloys, for example. The corrosion-resistant layer is typically sputtered onto the exterior surface of the bipolar plate substrate using a conventional magnetron sputtering process.

In step 3, a cover layer is deposited on the corrosion-resistant coating to minimize the contact resistance of the corrosion-resistant layer. The cover layer preferably has a thickness of less than typically about 10 nm. The cover layer may be, for example, gold (Au) or an organic material, for example.

Table (I) below presents the actual corrosion rates and the normalized corrosion rates for various grades of stainless steel, alloys and titanium. The corrosion rate and normalized corrosion rate of each sample was obtained by soaking the sample in an etching solution (1M $H_2SO_4$+0.1M HF) for an hour at 80 degrees C.

TABLE I

| Alloy | Corrosion rate (g/s) | Normalized corrosion rate |
|---|---|---|
| 304L ss | 8.87E−05 | 1 |
| 353 ss | 2.62E−05 | 0.296 |
| 316L ss | 1.89E−05 | 0.213 |
| Inconl 800 | 1.85E−05 | 0.208 |
| 317L ss | 8.19E−06 | 0.092 |
| Inconl 601 | 5.97E−06 | 0.067 |
| 904L ss | 7.50E−07 | 0.009 |
| 254SMO | 4.17E−07 | 0.005 |
| Carp-20 | 3.61E−07 | 0.004 |
| C-276 | 1.39E−07 | 0.002 |
| Titanium | 8.13E−05 | Limited stability in fluoride ion containing environments |

Figure 3:
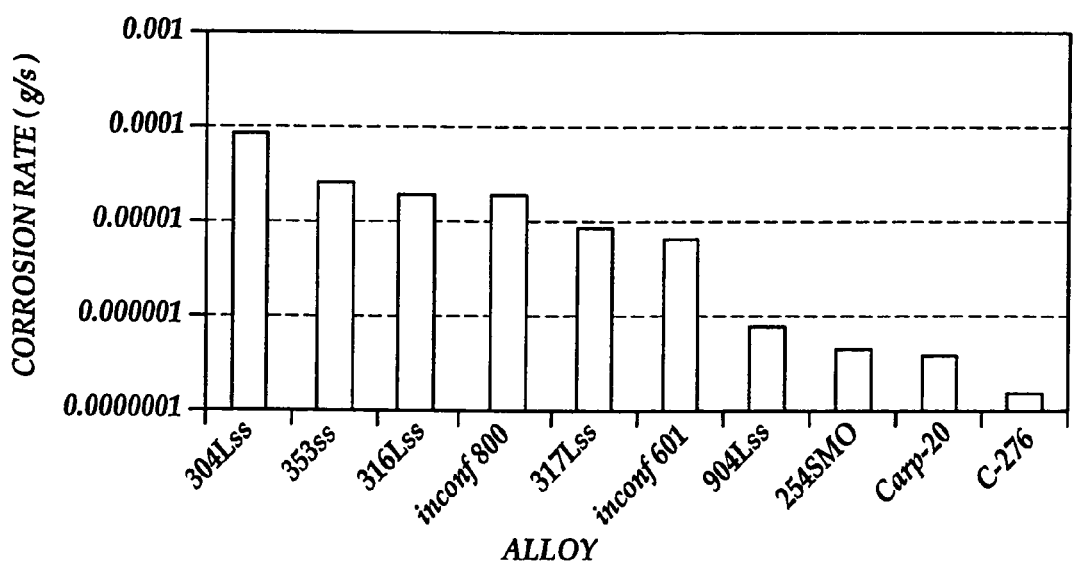
FIG. 3 is a bar graph which compares the corrosion rates (plotted along the Y-axis) of various stainless steel alloys (plotted along the X-axis)

Table (I) above shows that the higher the grade of stainless steel/alloy, the better the corrosion resistance of the stainless steel/alloy in a sulfuric acid/hydrogen fluoride mixture. The corrosion resistance of titanium in the same solution is comparable to that of 304L stainless steel. The bar graph of FIG. 3 prevents a visual comparison of the corrosion rates of various grades of stainless steel and various alloys.

The invention will be better understood by reference to the following example.

EXAMPLE

AL6XN Coating on Stainless Steel

One (1) micron of an AL6XN stainless steel alloy coating was sputtered on a 316L stainless steel sample using magnetron sputtering. The composition of the coating was analyzed using Electron Probe Microanalysis (EPM), the results of which are presented in Table (II) below.

|  | Material | | | |
| --- | --- | --- | --- | --- |
|  | Cr | Ni | Mo | Iron |
| AL6XN | 20 | 24 | 6.3 | 44-50 |
| Sputtered film | 23 | 22 | 7 | 47 |

From a consideration of Table (II), it can be seen that the composition of the sputtered AL6XN alloy was almost identical to the source AL6XN alloy. As such, in one embodiment of the invention, the same phase (as the target) of a costly high grade, high corrosion-resistant, stainless steel can be sputtered as a very thin layer on to a low grade, less expensive, lower corrosion-resistant stainless steel. In addition to allowing the same phase to be deposited, sputtering also avoids the environmental problems associated with plating. Sputtering also provides for superior adhesion of the corrosion-resistant coating to the bipolar plate substrate. The adhesion is particularly superior when high grade stainless steel is sputtered onto a lower grade stainless steel bipolar plate substrate.

Figure 4:
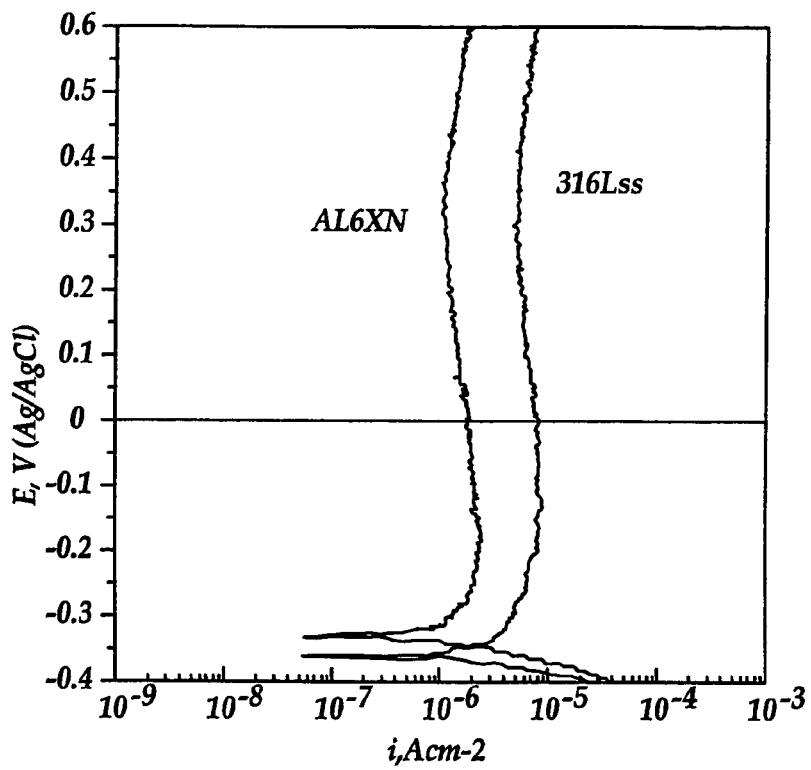
FIG. 4 is a graph on which is plotted potentiodynamic polarization curves obtained on 316L and AL6XN samples in a de-aerated 50 ppm HF solution of pH=3 and at 80 degrees C. (scan rate 0.1 mV/S)

The graph of FIG. 4 shows the corrosion behavior of the bulk AL6XN alloy as compared to that of the 316L stainless steel in de-aerated HF solutions of pH=3 and at 80 degrees C. The graph indicates that with regard to corrosion characteristics, the AL6XN alloy is vastly superior to the 316L stainless steel in the same potential domain.

Figure 5:
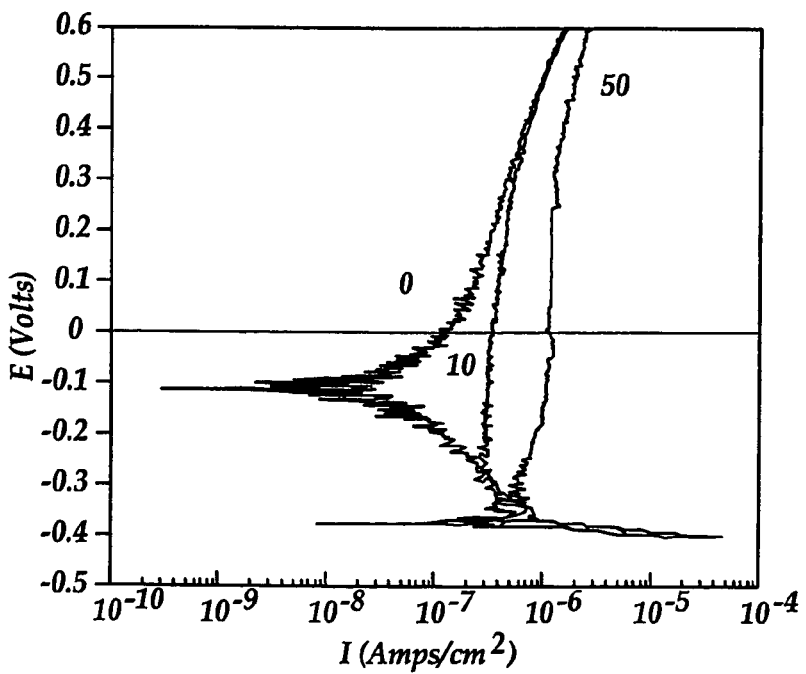
FIG. 5 is a graph on which is plotted polarization curves for a sputtered AL6XN alloy coating on 316L stainless steel in a de-aerated solution of pH=3 and at different fluoride ion concentrations at 80 degrees C.

The corrosion behavior of the sputtered AL6XN alloys on 316L stainless steel samples is shown in the graph of FIG. 5. FIG. 5 shows that the sputtered alloys show a similar behavior to that of the bulk alloy at 50 ppm, HF. The corrosion rates of the samples decrease with the decrease in the HF concentration.

Figure 6:
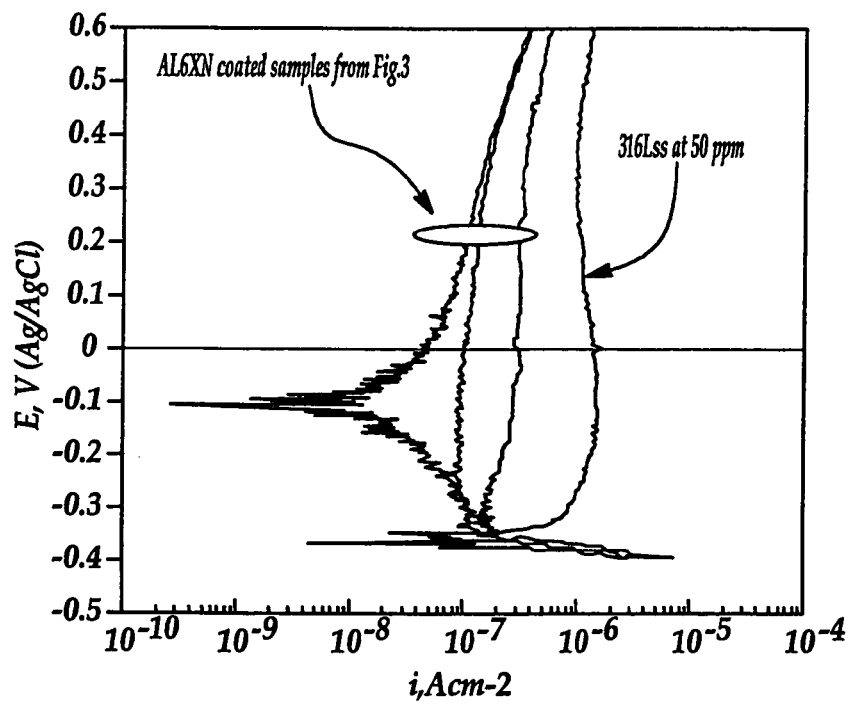
FIG. 6 is a graph which compares the polarization curves of FIG. 4 with the polarization curve obtained on 316L stainless steel at 50 ppm HF solution of pH=3 and at 80 degrees C.

The graph of FIG. 6 shows a comparison between the 316L stainless steel and the sputtered samples. According to the graph, sputtering of the AL6XN alloy on the stainless steel significantly enhances the corrosion properties of the substrate. A thicker coating is desired to increase the lifetime of the sputtered samples.

Coatings from the group of niobium and its alloys, tantalum and its alloys and molybdenum alloys are well known to those skilled in the art to have excellent corrosion resistances in aggressive environments. These coatings can be sputtered on top of lower grades of stainless steel to provide the required electrochemical stability in the fuel cells environment.

Figure 7:
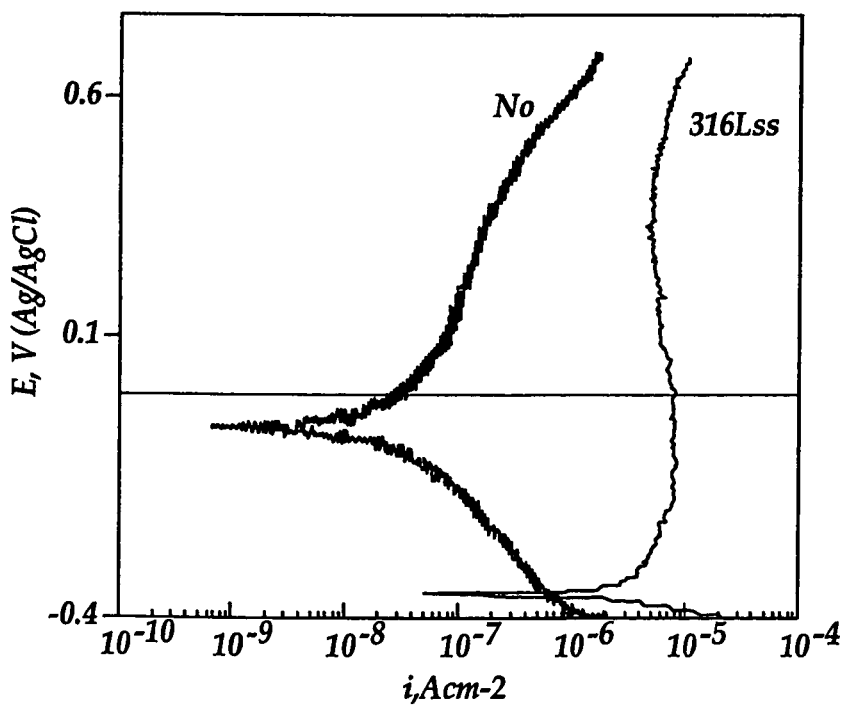
FIG. 7 is a graph on which is plotted potentiodynamic polarization curves obtained on 316L stainless steel and Nb in a de-aerated HF solution of pH=3 at 80 degrees C.

The graph of FIG. 7 shows potentiodynamic polarization curves obtained on niobium and 316L stainless steel in a de-aerated solution of 50 ppm HF of pH=3 at 80 degrees C. Under the same potential conditions, niobium exhibits a much lower current than does 316L stainless steel. Niobium also exhibits an excellent chloride-pitting corrosion resistance.

Figure 8:
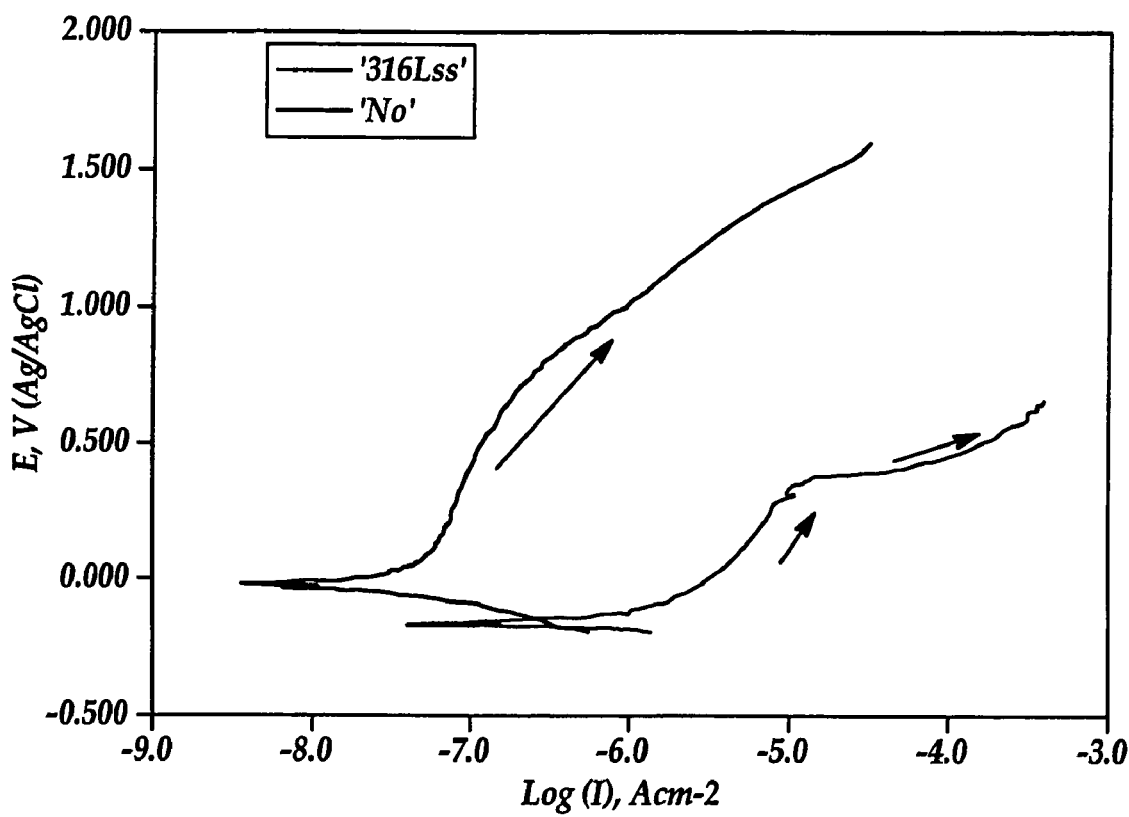
FIG. 8 is a graph on which is plotted polarization curves obtained on 316L stainless steel and Nb in de-aerated 3.5% NaCl solution at a scan rate of 1 mV/s and at room temperature.

FIG. 8 shows two potentiodynamic polarization curves obtained on 316L stainless steel and on niobium in 3.5% NaCl solution. The pitting potential for 316L is around 0.4 V (Ag/AgCl), while a much higher potential is seen for the niobium sample. Severe pitting was seen on the 316L stainless steel sample after the experiment, while no such pitting was observed on the niobium sample after the experiment. These data indicate that niobium, as a coating, combines both fluoride corrosion-resistance and chloride corrosion-resistance, properties which are required for bipolar plates since fluoride ions are released during degradation of the membrane and chloride ions are present in the humidified air stream in the fuel cell stack.

While the preferred embodiments of the invention have been described above, it will be recognized and understood that various modifications can be made in the invention and the appended claims are intended to cover all such modifications which may fall within the spirit and scope of the invention.

The invention claimed is:

1. A method for enhancing corrosion resistance of a fuel cell bipolar plate, comprising:
   providing a fuel cell bipolar plate substrate comprising a first material that comprises first, second, and third atomic elements, the bipolar plate substrate having a first corrosion resistance; and
   sputtering a corrosion-resistant coating on said bipolar plate substrate, the corrosion-resistant coating comprising a second material that comprises the first, second, and third atomic elements and having a second corrosion resistance, wherein the second corrosion resistance is greater than the first corrosion resistance and wherein the thickness of the corrosion-resistant coating is between 0.1 µm and 10 µm.

2. The method as set forth in claim 1 wherein the bipolar substrate comprises a metal.

3. The method as set forth in claim 1 wherein the first atomic element is iron, the second atomic element is nickel and the third atomic element is chromium.

4. The method as set forth in claim 1 wherein the sputtering comprises physical vaporization of a target comprising a material having a first elemental composition and wherein the corrosion-resistant coating has substantially the same first elemental composition.

5. The method as set forth in claim 1 wherein the thickness of the corrosion-resistant coating ranges from 0.1-2 µm.

6. The method as set forth in claim 1 wherein the bipolar plate substrate comprises a first grade of stainless steel and the corrosion-resistant coating comprises a second grade of stainless steel.

7. The method as set forth in claim 1 wherein said bipolar plate substrate comprises 304L grade stainless steel.

8. The method as set forth in claim 1 wherein the bipolar plate substrate comprises at least one of a ferrite or an austenitic material.

9. The method as set forth in claim 1 wherein the bipolar plate substrate comprises at least one of a low grade ferrite material or a low grade austenitic material.

10. The method as set forth in claim 1 wherein both the bipolar plate substrate and the corrosion-resistant coating each comprises chromium, and wherein the elemental weight percent of chromium in the corrosion-resistant coating is greater than the elemental weight percent of chromium in the bipolar plate substrate.

11. The enhanced stability bipolar plate as set forth in claim 1 wherein the corrosion-resistant coating consists essentially of a metal or metal alloy.

12. The method as set forth in claim 1 wherein sputtering comprises sputtering using a conventional magnetron sputtering process.

13. The method as set forth in claim 12 wherein the bipolar plate substrate comprises 304L or 316L stainless steel and the bipolar plate includes a gas flow field including a plurality of lands and channels having the corrosion-resistant coating thereon.

14. A method for enhancing corrosion resistance of a fuel cell bipolar plate, comprising:

providing a fuel cell bipolar plate substrate, the bipolar plate substrate comprising a metal alloy consisting essentially of 304L or 316L grade stainless steel; and sputtering a corrosion-resistant coating on said bipolar plate substrate, the corrosion-resistant coating consisting essentially of a grade of stainless steel having a higher elemental weight percent of chromium than the metal alloy, wherein the thickness of the corrosion-resistant coating ranges from 0.1 μm to 2 μm.

* * * * *